(12) United States Patent
Jung et al.

(10) Patent No.: US 12,578,661 B2
(45) Date of Patent: Mar. 17, 2026

(54) APPARATUS FOR CLEANING AN EXTREME ULTRAVIOLET LIGHT CREATION CHAMBER

(71) Applicant: SAMSUNG ELECTRONICS CO., LTD., Suwon-si (KR)

(72) Inventors: Dohyun Jung, Suwon-si (KR);
Youngduk Suh, Suwon-si (KR);
Sungwook Kang, Suwon-si (KR);
Sanggon Shin, Suwon-si (KR);
Seunghee Lee, Suwon-si (KR);
Jinwook Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 294 days.

(21) Appl. No.: 18/468,505

(22) Filed: Sep. 15, 2023

(65) Prior Publication Data

US 2024/0280917 A1     Aug. 22, 2024

(30) Foreign Application Priority Data

Feb. 20, 2023     (KR) ........................ 10-2023-0021978

(51) Int. Cl.
*G03F 7/00* (2006.01)
(52) U.S. Cl.
CPC ................................ *G03F 7/70925* (2013.01)

(58) Field of Classification Search
CPC .... G03F 7/70033; G03F 7/70925; B08B 1/12
See application file for complete search history.

(56) References Cited

U.S. PATENT DOCUMENTS

| | | | |
|---|---|---|---|
| 9,000,404 B2 | 4/2015 | Bykanov et al. | |
| 9,888,554 B2 | 2/2018 | Baek et al. | |
| 2010/0025231 A1* | 2/2010 | Moriya | H05G 2/0094 |
| | | | 204/298.31 |
| 2010/0192973 A1 | 8/2010 | Ueno et al. | |
| 2012/0298134 A1 | 11/2012 | Moriya et al. | |
| 2016/0207078 A1 | 7/2016 | Becker et al. | |
| 2022/0308339 A1* | 9/2022 | Lim | B24C 1/003 |
| 2022/0308465 A1 | 9/2022 | Huang et al. | |
| 2022/0326624 A1* | 10/2022 | Cheng | G06T 7/001 |
| 2025/0076775 A1* | 3/2025 | Cho | G03F 7/70916 |

* cited by examiner

*Primary Examiner* — Peter B Kim
(74) *Attorney, Agent, or Firm* — Morgan, Lewis & Bockius LLP

(57) ABSTRACT

An apparatus for cleaning an EUV light creation chamber may include a cleaning module, a first movement module and a second movement module. The first movement module may support the cleaning module in the EUV light creation chamber along a first direction. The second movement module may support the first movement module on a surface of the EUV light creation chamber at a position along a second direction perpendicular to the first direction.

20 Claims, 10 Drawing Sheets

APPARATUS FOR CLEANING AN EXTREME ULTRAVIOLET LIGHT CREATION CHAMBER

CROSS-RELATED TO RELATED APPLICATION

This application claims priority under 35 USC § 119 to Korean Patent Application No. 10-2023-0021978, filed on Feb. 20, 2023, in the Korean Intellectual Property Office (KIPO), the contents of which are herein incorporated by reference in their entirety.

TECHNICAL FIELD

Example embodiments relate to an apparatus for cleaning an extreme ultraviolet light creation chamber. More particularly, example embodiments relate to an apparatus configured to remove contaminants on an inner wall of a chamber in which an extreme ultraviolet light may be created.

DISCUSSION OF RELATED ART

Extreme ultraviolet (EUV) light may be used for performing an optical lithography process in manufacturing a semiconductor device. The optical lithography process using EUV light may have smaller features and improved resolutions as compared to conventional optical lithography processes. EUV light in the context of optical lithography may have a wavelength between about 4 and 40 nanometers, and more particularly about 13.5 nanometers.

The EUV light may be created using an EUV light creation apparatus. The EUV light creation apparatus may be a discharge produced plasma (DPP) type apparatus or a laser produced plasma (LPP) type apparatus, for example.

In the DPP type apparatus, a high voltage may be applied to a metal droplet which may form a high-density plasma. In the LPP type apparatus, a laser may irradiate a metal droplet, vaporizing the metal droplet and forming a high-density plasma. The high-density plasma may release light, and in particular, release EUV light. The EUV light may be released from the high-density plasma generated by either the DPP type apparatus or the LPP type apparatus.

In the LPP type apparatus, the droplet and the laser may be introduced into an EUV light creation chamber. The EUV light generated in the chamber may be reflected from a collector mirror toward an exposure chamber.

Byproducts generated by the LPP type apparatus from the vaporization of the droplet may be accumulated in the chamber. In particular, the byproducts may accumulate on a surface of the collector mirror and an inner wall of the chamber.

SUMMARY

Example embodiments provide an apparatus for cleaning an EUV light creation chamber that may be capable of cleaning an inner wall of the EUV light creation chamber.

According to example embodiments, there may be provided an apparatus for cleaning an EUV light creation chamber. The apparatus may include a cleaning module, a first movement module and a second movement module. The first movement module may support the cleaning module in the EUV light creation chamber along a first direction. The second movement module may support the first movement module on a bottom surface of the EUV light creation chamber at a position along a second direction perpendicular to the first direction.

According to example embodiments, there may be provided an apparatus for cleaning an EUV light creation chamber having a conical shape. The apparatus may include a cleaning module, a vertical movement module and a horizontal movement module. The vertical movement module may support the cleaning module in the EUV light creation chamber along a vertical direction. The vertical movement module may have a height control function. The horizontal movement module may support the cleaning module on a bottom surface of the EUV light creation chamber along a horizontal direction. The cleaning module may include a base, a cleaning shaft, a brush, a rotating actuator, and a sensor. The base may be disposed on the vertical movement module and positioned along the vertical direction by the vertical movement module. The cleaning shaft may be connected to the base. The brush may be connected to the cleaning shaft. The brush may include nano wires having a hardness lower than a hardness of the EUV light creation chamber. The rotating actuator may be connected to the brush. The sensor may measure a distance to the inner wall of the EUV light creation chamber.

According to example embodiments, there may be provided an apparatus for cleaning an EUV light creation chamber having a conical shape. The apparatus may include a brush disposed at an end portion of a cleaning shaft, a first tilting actuator disposed on a base and controlling a first tilt of the cleaning shaft, and a second tilting actuator disposed on the base and controlling a second tilt of the cleaning shaft. The apparatus may include a first movement plate supporting the first tilting actuator and the second tilting actuator, and a second movement plate supporting the first movement plate, wherein the first movement plate and the second movement plate are moveable in a first direction and a second direction perpendicular to the first direction.

According to example embodiments, the vertical movement module may have a height control function so that the apparatus may readily enter into the EUV light creation chamber through a door of the EUV light creation chamber having a low height. The cleaning module may approach to regions of the inner wall of the EUV light creation chamber having a conical shape by the vertical movement module and the horizontal movement module to remove a contaminant from the inner wall of the EUV light creation chamber. In particular, the hardness of the nano wires of the brush may be higher than a hardness of the contaminant and lower than a hardness of the EUV light creation chamber so that the contaminant on the inner wall of the EUV light creation chamber may be removed without a damage of the EUV light creation chamber by the brush.

BRIEF DESCRIPTION OF THE DRAWINGS

Example embodiments will be more clearly understood from the following detailed description taken in conjunction with the accompanying drawings.

FIG. 1 is a perspective view illustrating an apparatus for cleaning an EUV light creation chamber in accordance with example embodiments;

FIG. 2 is an enlarged perspective view illustrating a cleaning module of the apparatus in FIG. 1;

FIG. 3 is an enlarged cross-sectional view illustrating a brush and a sensor of the cleaning module in FIG. 2;

FIG. 4 is a perspective view illustrating the apparatus in FIG. 1 arranged in the EUV light creation chamber;

FIG. 5, FIG. 6, FIG. 7, FIG. 8, and FIG. 9 are perspective views illustrating a cleaning operation of the apparatus in FIG. 1;

FIG. 10 is a perspective view illustrating an apparatus for cleaning an EUV light creation chamber in accordance with example embodiments; and FIG. 11 is a perspective view illustrating an apparatus for cleaning an EUV creation light chamber in accordance with example embodiments.

DETAILED DESCRIPTION

Hereinafter, example embodiments will be explained in detail with reference to the accompanying drawings.

Figure 1:
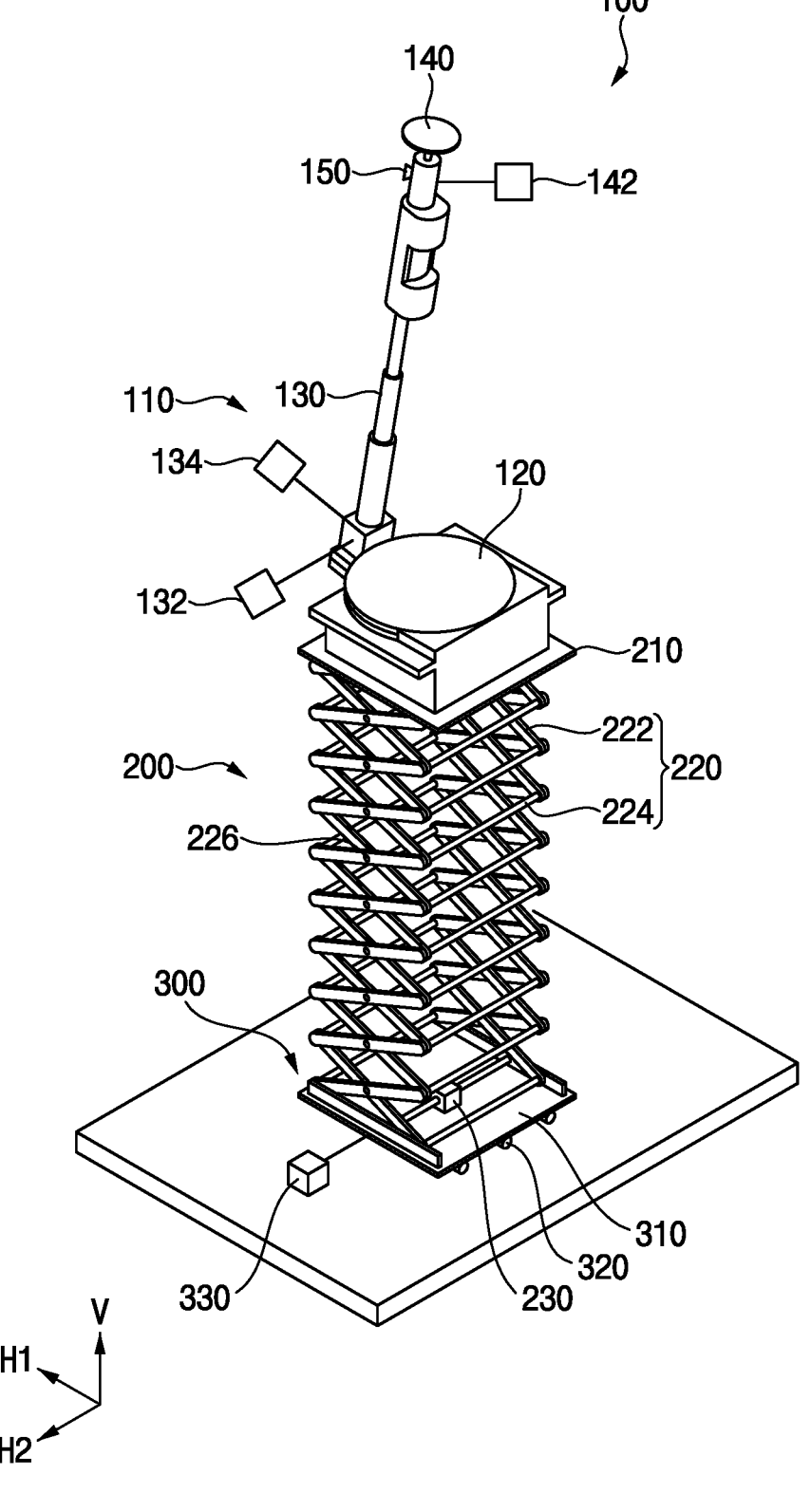
FIGS. 1 to 11 represent non-limiting, example embodiments as described herein.
Figure 2:
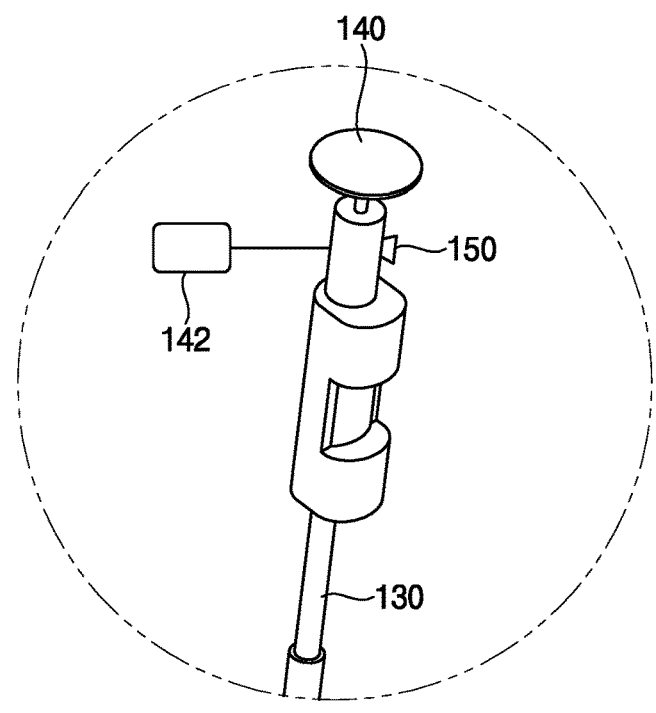
Figure 3:
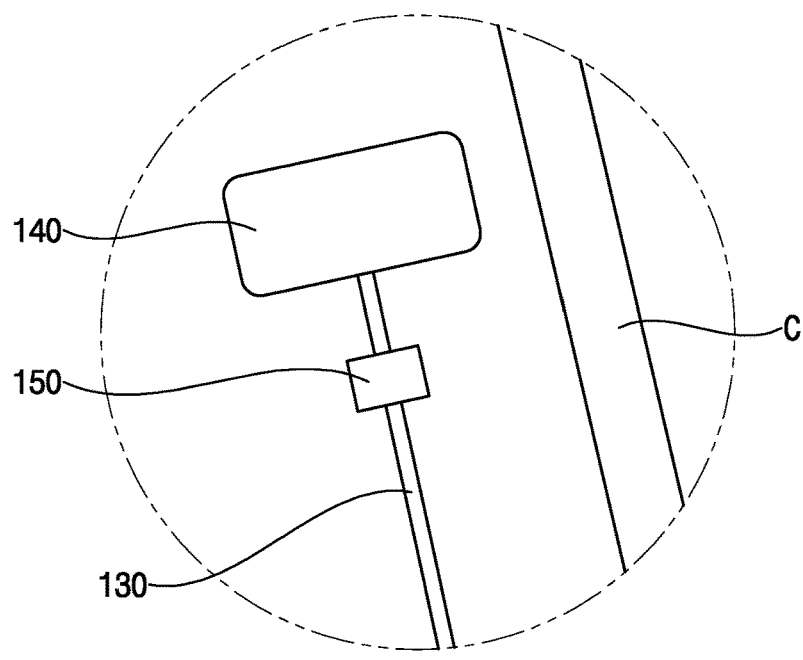
Figure 4:
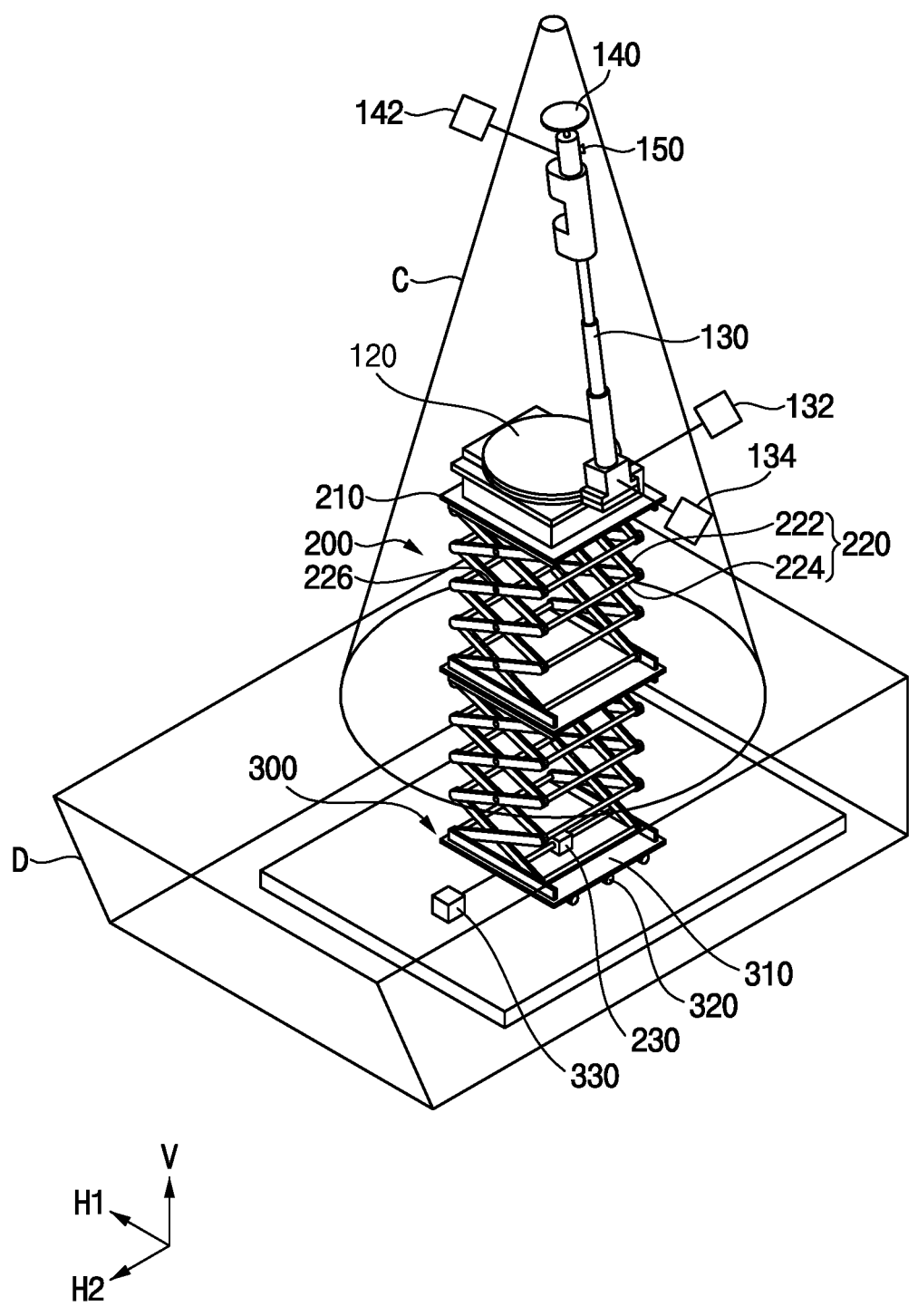

FIG. 1 is a perspective view illustrating an apparatus for cleaning an extreme ultraviolet (EUV) light creation chamber in accordance with example embodiments. FIG. 2 is an enlarged perspective view illustrating a cleaning module of the apparatus in FIG. 1. FIG. 3 is an enlarged cross-sectional view illustrating a brush and a sensor of the cleaning module in FIG. 2. FIG. 4 is a perspective view illustrating the apparatus in FIG. 1 arranged in the EUV light creation chamber.

Referring to FIGS. 1 to 4, a laser produced plasma (LPP) type EUV light creation apparatus may create EUV light from a high-density plasma formed by irradiating a molten metal droplet with a laser. The EUV light may be created in an EUV light creation chamber C. The molten metal may be, for example, a tin, a tin compound, or a tin alloy.

The EUV light creation chamber C may have a conical shape (see FIG. 4). Thus, the EUV light creation chamber C may have gradually decreased widths from a bottom of the chamber C to a top of the chamber C. The EUV light creation chamber C may have an opened bottom surface. A focusing aperture may be formed at an upper surface of the EUV light creation chamber C. The EUV light may pass through the focusing aperture. An exhaust opening may be formed at a sidewall of the EUV light creation chamber C. Byproducts generated during the creation of the EUV light may be exhausted through the exhaust opening. The exhaust opening may be connected to a scrubber.

Further, the EUV light creation chamber C may include a material that may not be damaged by the plasma. For example, the EUV light creation chamber C may be formed of a stainless steel (SUS) material. A copper layer may be coated on a portion of the inner wall of the EUV light creation chamber C. For example, the copper layer may be coated on an upper portion of the inner wall of the EUV light creation chamber C adjacent to the focusing aperture.

The EUV light creation chamber C may include a door D. The door D may be provided to a lower portion of the sidewall of the EUV light creation chamber C.

A material supplier may be arranged to a side of the EUV light creation chamber C. The material supplier may supply the droplet into the EUV light creation chamber C along a third direction V.

The droplet may be positioned at a laser irradiation point in the EUV light creation chamber C by a controller. The controller may control a position of the material supplier. For example, the controller may move the material supplier in a horizontal direction and the third direction V.

A laser irradiator may be arranged under the EUV light creation chamber C. The laser irradiator may irradiate a laser into the EUV light creation chamber C through the opening bottom surface of the EUV light creation chamber C. An irradiation direction of the laser from the laser irradiator may be substantially perpendicular to a supplying direction of the droplet from the material supplier. The laser may be a carbon-dioxide laser ($CO_2$ laser). The laser may be based on other technologies.

A collector mirror may be arranged at the opened bottom surface of the EUV light creation chamber C. The collector mirror may reflect the EUV light toward the focusing aperture. For example, the collector mirror may reflect the EUV light generated in the EUV light creation chamber C toward the focusing aperture. The EUV light passing through the focusing aperture may be incident to an exposure chamber.

The creation of the EUV light may produce contaminants as byproducts. The byproducts may include material from the droplet (e.g., tin). The contaminants may accumulate on the inner wall of the EUV light creation chamber C. For example, the contaminants may accumulate on an upper inner wall of the EUV light creation chamber C and the copper layer.

A cleaning apparatus 100 of example embodiments may effectively remove the contaminants from the inner wall of the EUV light creation chamber C, and in particular from the copper layer. The cleaning apparatus 100 may enter into the EUV light creation chamber C through the door D. The cleaning apparatus 100 may include a cleaning module 110, a vertical movement module 200 and a horizontal movement module 300. The horizontal movement module 300 may support the vertical movement module 200 at a horizontal position along a bottom surface of the EUV light creation chamber C. The vertical movement module 200 may support the cleaning module 110 in the EUV light creation chamber along a vertical direction.

The cleaning module 110 may include a base 120, a cleaning shaft 130, a first tilting actuator 132, a second tilting actuator 134, a brush 140, a rotating actuator 142 and a sensor 150.

The base 120 may be disposed on the vertical movement module 200 and be positioned along the vertical direction by the vertical movement module 200. The base 120 may have a cylindrical shape. The base 120 may have other shapes, such as a rectangular plate shape. The base 120 may have a size that allows the base 120 to enter into the door D.

The cleaning shaft 130 may be connected to the base 120. For example, the cleaning shaft 130 may be connected to a side surface of the base 120. The cleaning shaft 130 may be connected to other portions of the base 120. The cleaning shaft 130 may be rotatably connected to the base 120 with respect to a first direction H1. The first direction H1 may be a horizontal direction substantially perpendicular to the side surface of the base 120. Further, the cleaning shaft 130 may be rotatably connected to the base 120 with respect to a second direction H2, which may be substantially perpendicular to the first direction H1. The second direction H2 may be a horizontal direction substantially parallel to the side surface of the base 120. The rotation connection between the cleaning shaft 130 and the base 120 with respect to the first direction H1 and the second direction H2 may be achieved by a coupling, such as, a universal joint. The cleaning shaft 130 may be detachably connected to the base 120. In the case of a detachably connection, the cleaning shaft 130 may be selectively connected to the base 120 using a fixing member such as a bolt.

In example embodiments, the cleaning shaft 130 may have a telescopic structure. The telescopic structure may include a plurality of poles having sequentially decreased diameters. The poles may be fit within one another. A poll with a smaller diameter may slide out from a next poll with a larger diameter, lengthening the cleaning shaft 130. A length of the cleaning shaft 130, and a height of the cleaning shaft 130, may be adjusted by expanding or shrinking the polls. In some example embodiments, the cleaning shaft 130 may include a single shaft, and may not include a length control function.

The first tilting actuator 132 may tilt the cleaning shaft 130 with respect to the first direction H1. For example, the first tilting actuator 132 may tilt the cleaning shaft 130 with respect to the first direction H1 to position the cleaning shaft 130 substantially parallel to or perpendicular to an upper surface of the base 120. In particular, the cleaning apparatus 100 may pass through the door D, the first tilting actuator 132 may locate the cleaning shaft 130 substantially parallel to the upper surface of the base 120. By locating the cleaning shaft 130 substantially parallel to the upper surface of the base 120, an interference between the cleaning shaft 130 and the door D may be prevented. When the cleaning apparatus 100 enters into the EUV light creation chamber C through the door D, the first tilting actuator 132 may tilt the cleaning shaft 130 with respect to the first direction H1 to position the cleaning shaft 130 substantially perpendicular to the upper surface of the base 120.

The second tilting actuator 134 may tilt the cleaning shaft 130 with respect to the second direction H2. In a case where the EUV light creation chamber C has a slant inner wall, the second tilting actuator 134 may tilt the cleaning shaft 130 with respect to the second direction H2. By tilting the cleaning shaft 130 with respect to the second direction H2, an axial direction of the cleaning shaft 130 may be substantially parallel to the slant inner wall of the EUV light creation chamber C.

The brush 140 may be disposed at an upper end portion of the cleaning shaft 130. The brush 140 may make rotational contact with the inner wall of the EUV light creation chamber C to remove the contaminant from the inner wall of the EUV light creation chamber C.

In example embodiments, the brush 140 may include a plurality of nano-wires. In particular, the nano-wires of the brush 140 may have a hardness higher than a hardness of the contaminant and lower than a hardness of the inner wall of the EUV light creation chamber C. For nano-wires having a hardness lower than the hardness of the contaminant, a removal efficiency of the contaminant by the nano-wires may be decreased. For nano-wires having a hardness higher than the hardness of the inner wall of the EUV light creation chamber C, the inner wall of the EUV light creation chamber C may be damaged by the nano-wires. In example embodiments in which the nano-wires have a hardness higher than the hardness of the contaminant and lower than the hardness of the inner wall of the EUV light creation chamber C, the contaminant may be removed, and the EUV light creation chamber C may not be damaged. For example, because the contaminant may include tin, the hardness of the nano-wires may be higher than a hardness of tin. Further, because the EUV light creation chamber C may include the copper layer, the hardness of the nano-wires may be lower than a hardness of copper. That is, because the hardness of tin may be about 1.5 Mohs and the hardness of copper may be about 3 Mohs, the hardness of the nano-wires may be within about 1.5 Mohs and about 3 Mohs. The nano-wires may include, for example, zinc, gold, silver, or aluminum. The nano-wires of example embodiments may include silver.

The rotating actuator 142 may rotate the brush 140 with respect to a third direction V. The third direction V may be a vertical direction substantially perpendicular to the first direction H1 and the second direction H2. A working surface of the brush 140 may make rotational contact with the inner wall of the EUV light creation chamber C by the rotating actuator 142 to remove the contaminant. For example, the working surface of the brush 140 may be an outer circumferential surface. For example, the cleaning shaft 130 may be tilted by one or more of the first tilting actuator 132 or the second tilting actuator 134 with respect to the third direction V, the brush 140 may be rotated with respect to a tilted axis of the cleaning shaft 130. At least one of the first tilting actuator 132 or the second tilting actuator 134 may enable changes in an orientation of the brush 140, and a rotation center of the brush 140 may not be limited in the third direction V to the direction substantially perpendicular to the first direction H1 and the second direction H2.

The sensor 150 may be attached to the cleaning shaft 130. The sensor 150 may sense a distance to the inner wall of the EUV light creation chamber C. The sensor 150 may sense a distance between the cleaning shaft 130 and the inner wall of the EUV light creation chamber C. The sensor 150 may sense a distance between the brush 140 and the inner wall of the EUV light creation chamber C. A tilted angle of the brush 140 may be adjusted using the second tilting actuator 134 in accordance with the distance detected by the sensor 150 to provide the brush 140 at a distance from the EUV light creation chamber C for removing the contaminant. In some cases, the tilted angle of the brush 140 may be adjusted using the first tilting actuator 132 in accordance with the distance detected by the sensor 150.

The vertical movement module 200 may move the cleaning module 110 along the third direction V. For example, the vertical movement module 200 may upwardly move the cleaning module 110 in the EUV light creation chamber C. Further, to enter the cleaning apparatus 100 into the door D of the EUV light creation chamber C, the vertical movement module 200 may have a height control function for controlling a height of the cleaning apparatus 100. The vertical movement module 200 may include a vertical movement plate 210, a lifter 220 and a vertical actuator 230.

The cleaning module 110 may be disposed on the vertical movement plate 210. The vertical movement plate 210 may be connected to the cleaning module 110. In particular, the vertical movement plate 210 may be connected to a lower surface of the base 120 in the cleaning module 110. The vertical movement plate 210 may have, for example, a rectangular plate shape, or a circular plate shape.

The lifter 220 may be connected between the vertical movement plate 210 and the horizontal movement module 300. The lifter 220 may have a height control function. In example embodiments, the lifter 220 may include a foldable link structure, which may also be known as a scissor lift. The foldable link structure may include a plurality of links 222 arranged in a cross shape. Both ends of the links 222 may be rotatably connected with each other via pivot points or hinges 224. Middle portions of adjacent ones of the links 222 may be rotatably connected with each other via middle pivot points 226. Adjacent ones of the links 222 may cross one another at middle portions thereof. A middle pivot point may connect the adjacent ones of the links 222, and enable the adjacent links to rotate around the middle pivot point. The links 222 may be closed or opened, which may increase or decrease a height of the foldable link structure. For example, in an opened state, the ends of the links 222 are moved apart, the links 222 take an increasingly horizontal orientation, and a height of the vertical movement plate 210 may be reduced. In a closed state, the ends of the links 222 are moved together, the links 222 take an increasingly vertical orientation, and a height of the vertical movement plate 210 may be increased.

The vertical actuator 230 may provide the lifter 220 with a vertical movement force. That is, the vertical actuator 230 may open or close the links 222. For example, the vertical actuator 230 may be connected to a lowermost link of the links 222 to open or close the lowermost link. For example, in the case that the lowermost link is opened, the plurality of links 222 may be opened given the vertical movement force and the connections between the plurality of links 222.

The horizontal movement module 300 may move the vertical movement module 200 in the EUC light creation chamber C along a horizontal direction. In particular, the horizontal movement module 300 may move the vertical movement module 200 along the bottom surface of the EUV link creation chamber C. The horizontal movement module 300 may include a horizontal movement plate 310, a plurality of casters 320 and a horizontal actuator 330.

The vertical movement module 200 may be disposed on the horizontal movement plate 310. The horizontal movement plate 310 may be connected to the vertical movement module 200. The horizontal movement plate 310 may have a rectangular plate shape, but not limited thereto.

The casters 320 may be arranged at a lower surface or a side surface of the horizontal movement plate 310. The casters 320 may be rotated through an angle of about 360° with respect to the horizontal movement plate 310. That is, the casters 320 may be rotated with respect to the third direction V. The horizontal movement plate 310 may be moved to a position on the bottom surface of the EUV light creation chamber C by movements of the casters 320.

The horizontal actuator 330 may provide the horizontal movement plate 310 with a horizontal movement force. That is, the horizontal actuator 330 may move the horizontal movement plate 310 along the bottom surface of the EUV light creation chamber C along various horizontal directions.

It should be understood that while the EUV light creation chamber C and the cleaning apparatus 100 may be described in terms of the EUV light creation chamber C being arranged in a vertical orientation, the EUV light creation chamber C being arranged in another orientation, for example, a horizontal orientation, and that the vertical and horizontal directions may be merely used to describe respective perpendicular directions. For example, the vertical movement module 200 may move the cleaning module 110 along a first direction of the EUV light creation chamber C and the horizontal movement module 300 may move the vertical movement module 200 in the EUV light creation chamber C along a second direction, wherein the second direction is substantially perpendicular to the first direction. As described, the vertical movement module 200 may be a first movement module and the horizontal movement module 300 may be a second movement module. The vertical movement module 200 and the horizontal movement module 300 may each be moveable such that the brush 140 may clean a contaminant from the inner surface of the EUV light creation chamber C.

FIGS. 5 to 9 are perspective views illustrating a cleaning operation of the cleaning apparatus 100 in FIG. 1.

Figure 5:
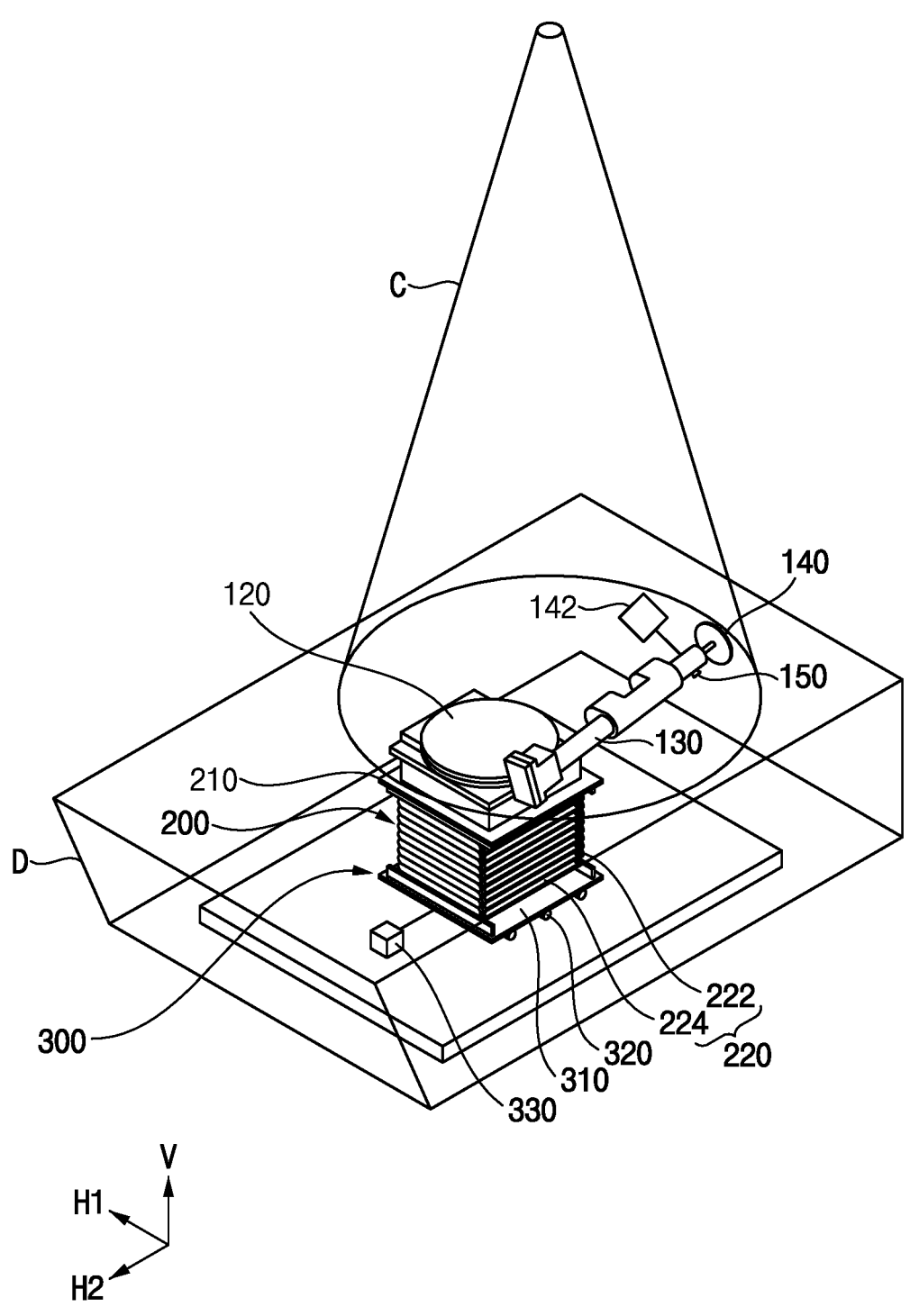

Referring to FIG. 5, the lifter 220 may be in an opened state. The cleaning shaft 130 may be substantially coplanar with the upper surface of the base 120. The cleaning shaft 130 may be horizontally arranged at the base 120 along the second direction H2. The cleaning apparatus 100 may have a height that enables to the cleaning apparatus 100 to enter into the door D. Further, the telescopic structure of the cleaning shaft 130 may be an insertion state. For example, the telescopic structure of the cleaning shaft 130 may be in a shortened state. Thus, a protruded length of the cleaning shaft 130 from the base 120 along the second direction H2 may be reduced or minimized.

The horizontal movement module 300 may enter into the EUV light creation chamber C through the door D. In particular, the horizontal actuator 330 may horizontally move the horizontal movement plate 310. The cleaning apparatus 100 may enter into the EUV light creation chamber C through the door D when the cleaning apparatus 100 has a low height. The low height may be less than a height of the door D.

Figure 6:
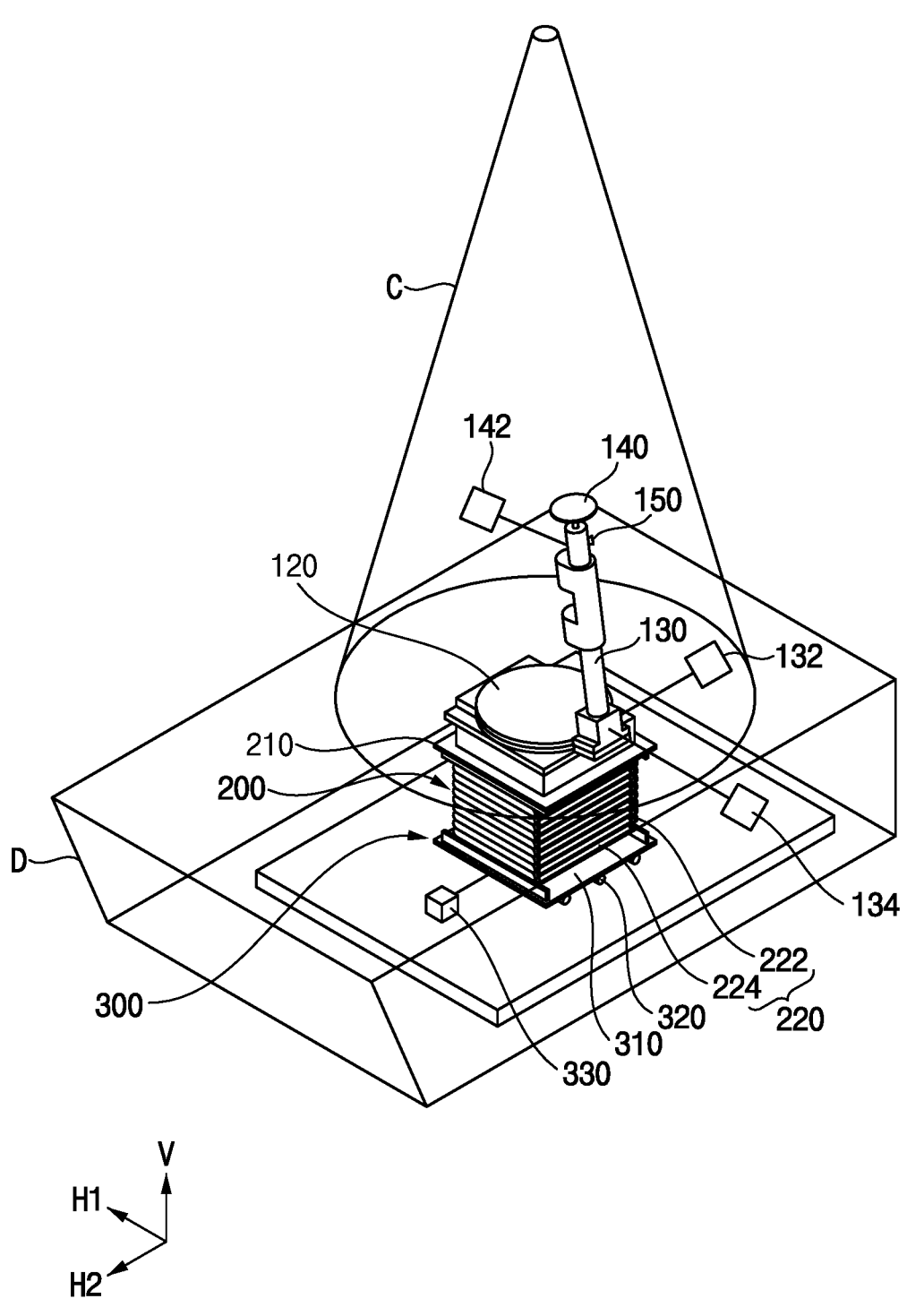

Referring to FIG. 6, the first tilting actuator 132 may tilt the cleaning shaft 130 at an angle of about 90° with respect to the first direction H1 and the cleaning apparatus 100 may enter into the EUV light creation chamber C. The cleaning shaft 130 may be raised. For example, the cleaning shaft 130 may be raised to a vertical orientation as the cleaning apparatus 100 enters into the EUV light creation chamber C. Further, the telescopic structure may be expanded to increase the length of the cleaning shaft 130, and the height of the cleaning shaft 130 may be increased.

Figure 7:
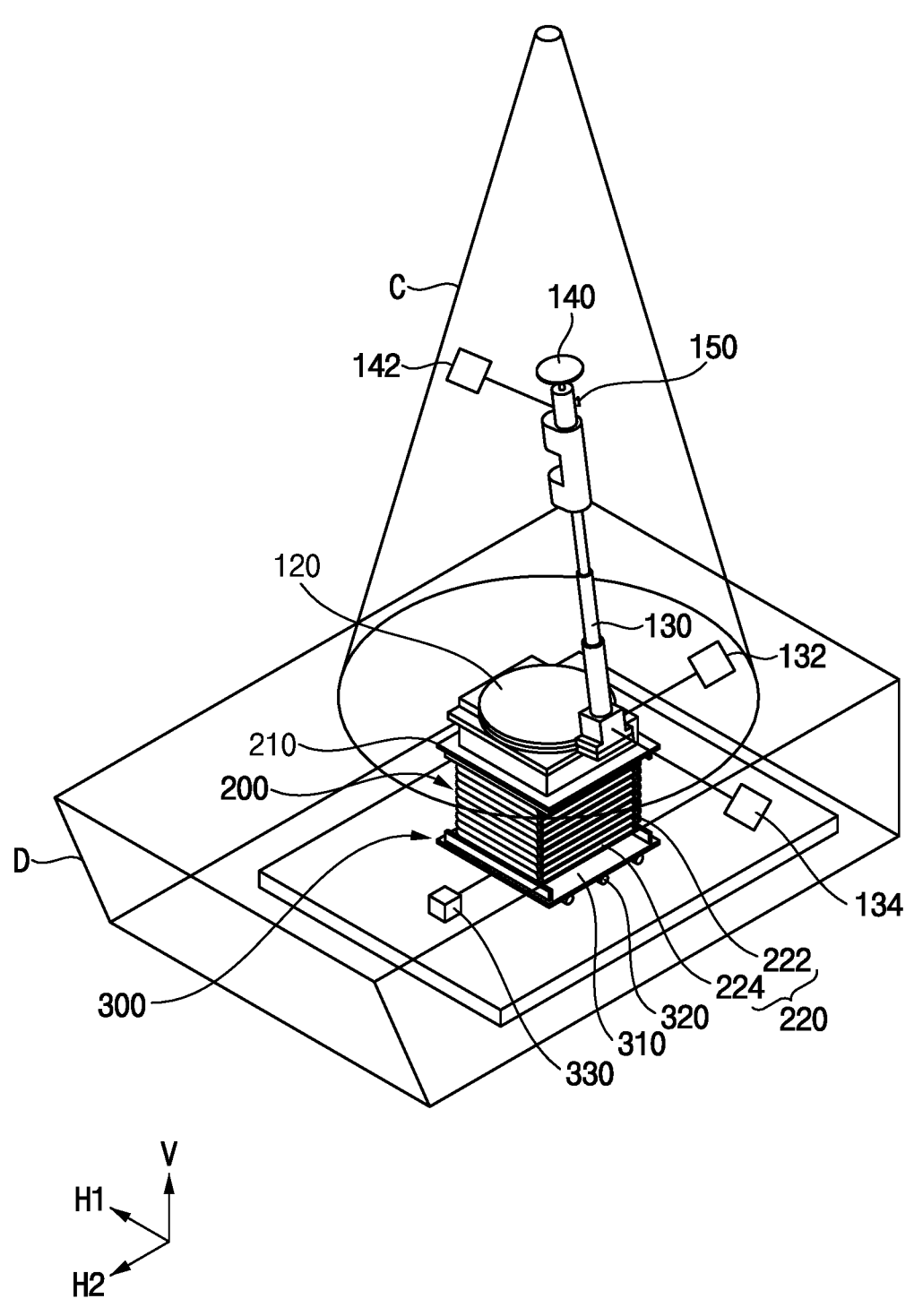

Referring to FIG. 7, the second tilting actuator 134 may tilt the cleaning shaft 130 with respect to the second direction H2. The second tilting actuator 134 may tilt the cleaning shaft 130 with respect to the second direction H2 to position the cleaning shaft 130 substantially parallel to the slant inner wall of the EUV light creation chamber C. Thus, the working surface of the brush 140 may also be substantially parallel to the slant inner wall of the EUV light creation chamber C.

Figure 8:
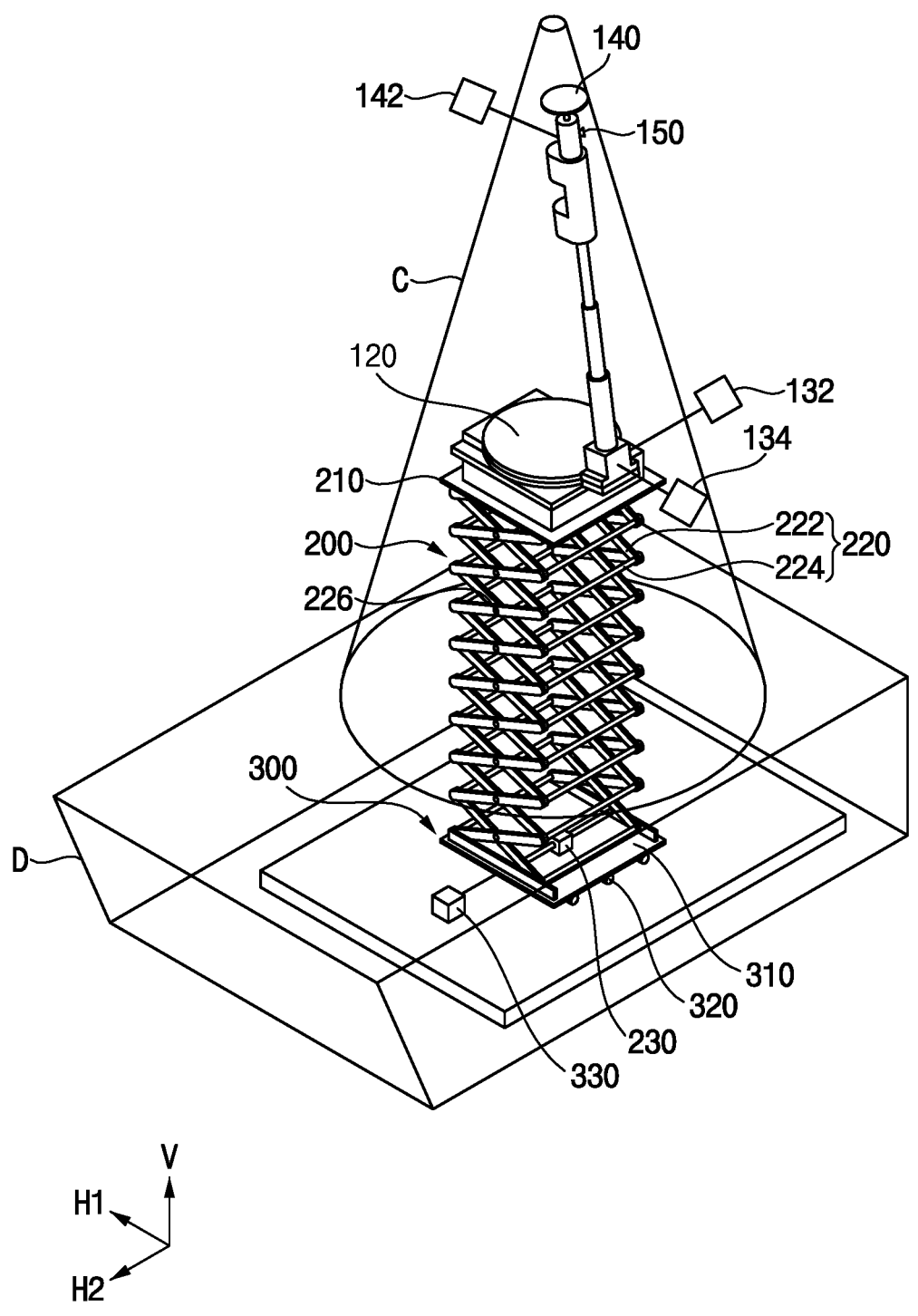

Referring to FIG. 8, the vertical actuator 230 may close the foldable link structure of the lifter 220. The vertical movement plate 210 may be upwardly moved by the lifter 220 when the vertical actuator 230 closes the foldable link structure of the lifter 220.

Figure 9:
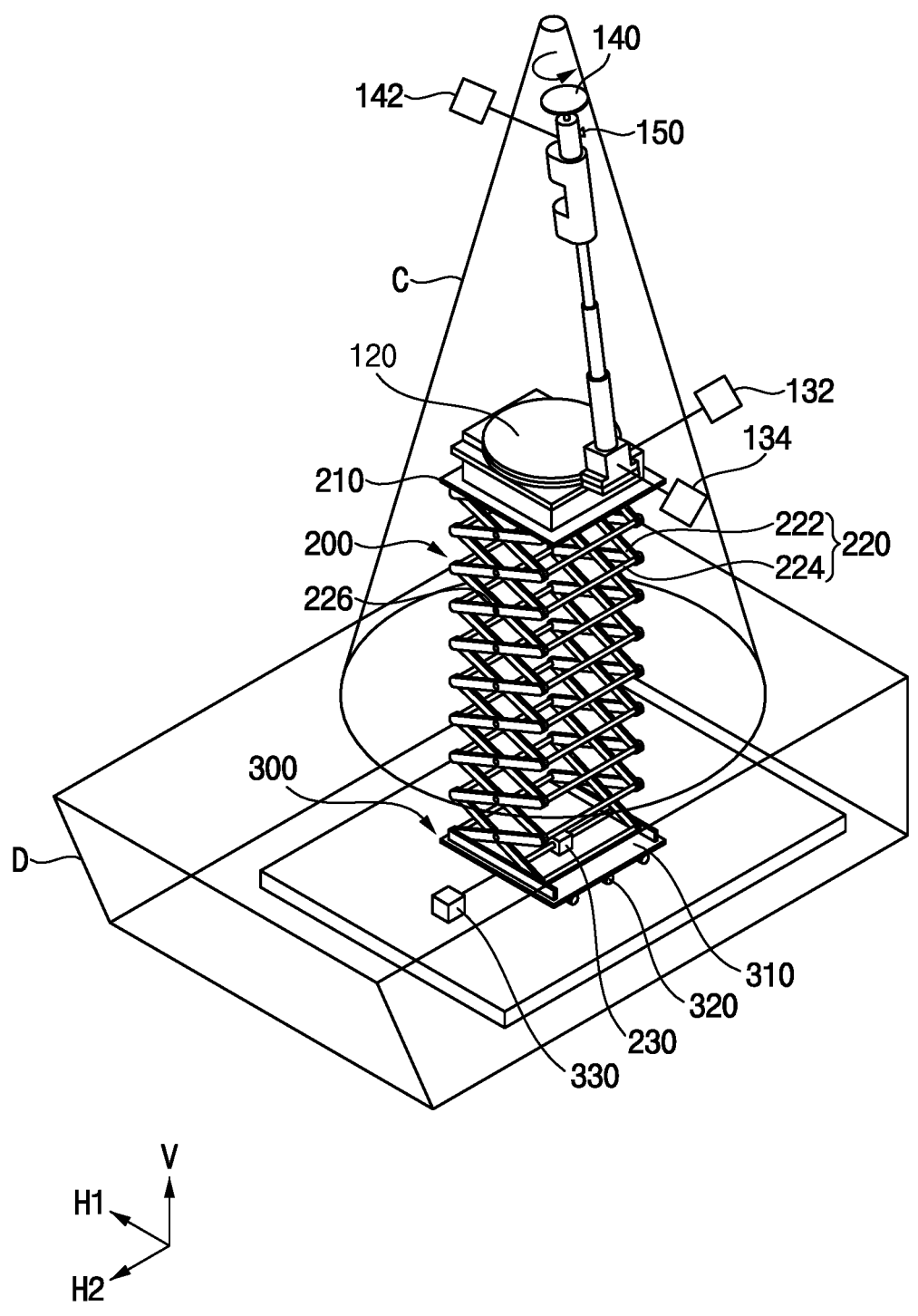

Referring to FIG. 9, the rotating actuator 142 may rotate the brush 140 with respect to the third direction V or the tilted axis of the brush 140. The brush 140, which may be rotating, may make contact with the inner wall of the EUV light creation chamber C. The brush 140 may remove the contaminant from the inner wall of the EUV light creation chamber C. For example, a working surface of the brush 140 may contact the inner wall of the EUV light creation chamber C and remove the contaminant from the inner wall of the EUV light creation chamber C.

In example embodiments, the upward movement of the vertical movement plate 210 by the vertical actuator 230 and the rotation of the brush 140 by the rotating actuator 142 may be performed simultaneously. That is, the brush 140, which may be rotation, may be upwardly moved along the inner wall of the EUV light creation chamber C to remove the contaminant. Further, the horizontal movement module 300 may move along the bottom surface of the EUV light creation chamber C to locate the brush 140 at a position.

Further, the sensor 150 may continuously measure the distance between the brush 140 and the inner wall of the EUV light creation chamber C. The distance measured by the sensor 150 may be compared with a reference distance between the brush 140 and the inner wall of the EUV light creation chamber C. The reference distance may correspond to a distance between the brush 140 and the inner wall of the EUV light creation chamber C without the contaminant. When the distance measured by the sensor 150 is within a range set from the reference distance, the contaminant of a corresponding region in the inner wall of the EUV light creation chamber C may be removed. In contrast, when the distance measured by the sensor 150 may be beyond the range set from the reference distance, the contaminant of the corresponding region in the inner wall of the EUV light creation chamber C may not be removed. In this case, the corresponding region in the inner wall of the EUV light creation chamber C may be cleaned using the cleaning apparatus 100.

Figure 10:
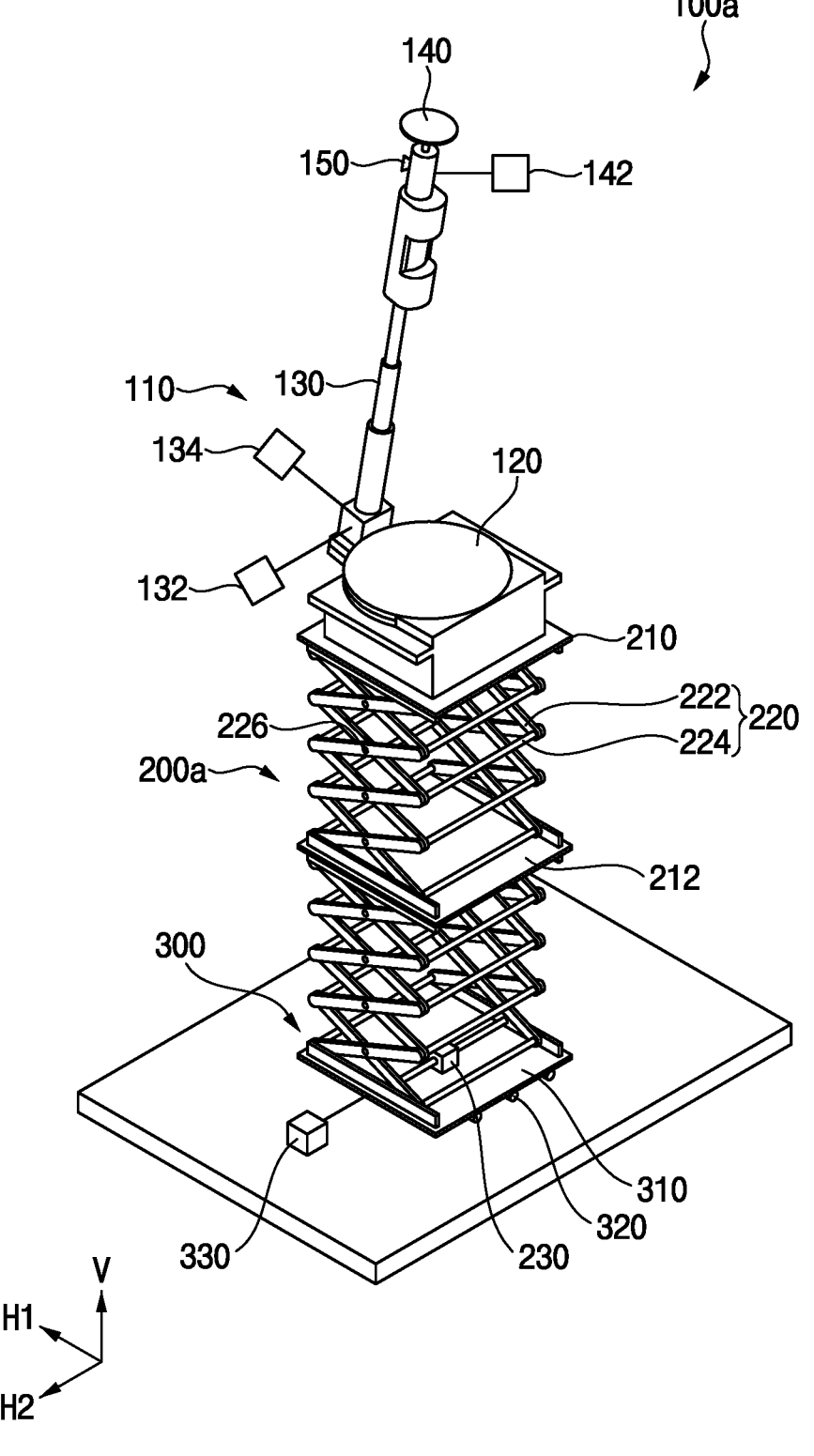

FIG. 10 is a perspective view illustrating an apparatus for cleaning an EUV light creation chamber in accordance with example embodiments.

A cleaning apparatus 100a of example embodiments may include elements substantially the same as those of the cleaning apparatus 100 in FIG. 1. The cleaning apparatus 100a may further include an auxiliary vertical movement plate 212. The same reference numerals may refer to the same elements and any further illustrations with respect to the same elements may be omitted herein for brevity.

Referring to FIG. 10, a vertical movement module 200a of example embodiments may further include the auxiliary vertical movement plate 212. The auxiliary vertical movement plate 212 may be interposed at a middle portion of the lifter 220. That is, the auxiliary vertical movement plate 212 may be installed at a middle portion of the foldable link structure. Thus, the auxiliary vertical movement plate 212 may be lifted together with the foldable link structure.

In a case that the foldable link structure has a closed structure and a high height, the auxiliary vertical movement plate 212 may provide the foldable link structure with structural stability. In example embodiments, the auxiliary vertical movement plate 212 may be a single plate. In another example, the auxiliary vertical movement plate 212 may include at least two plates. Other configurations of the auxiliary vertical movement plate 212 are contemplated.

Figure 11:
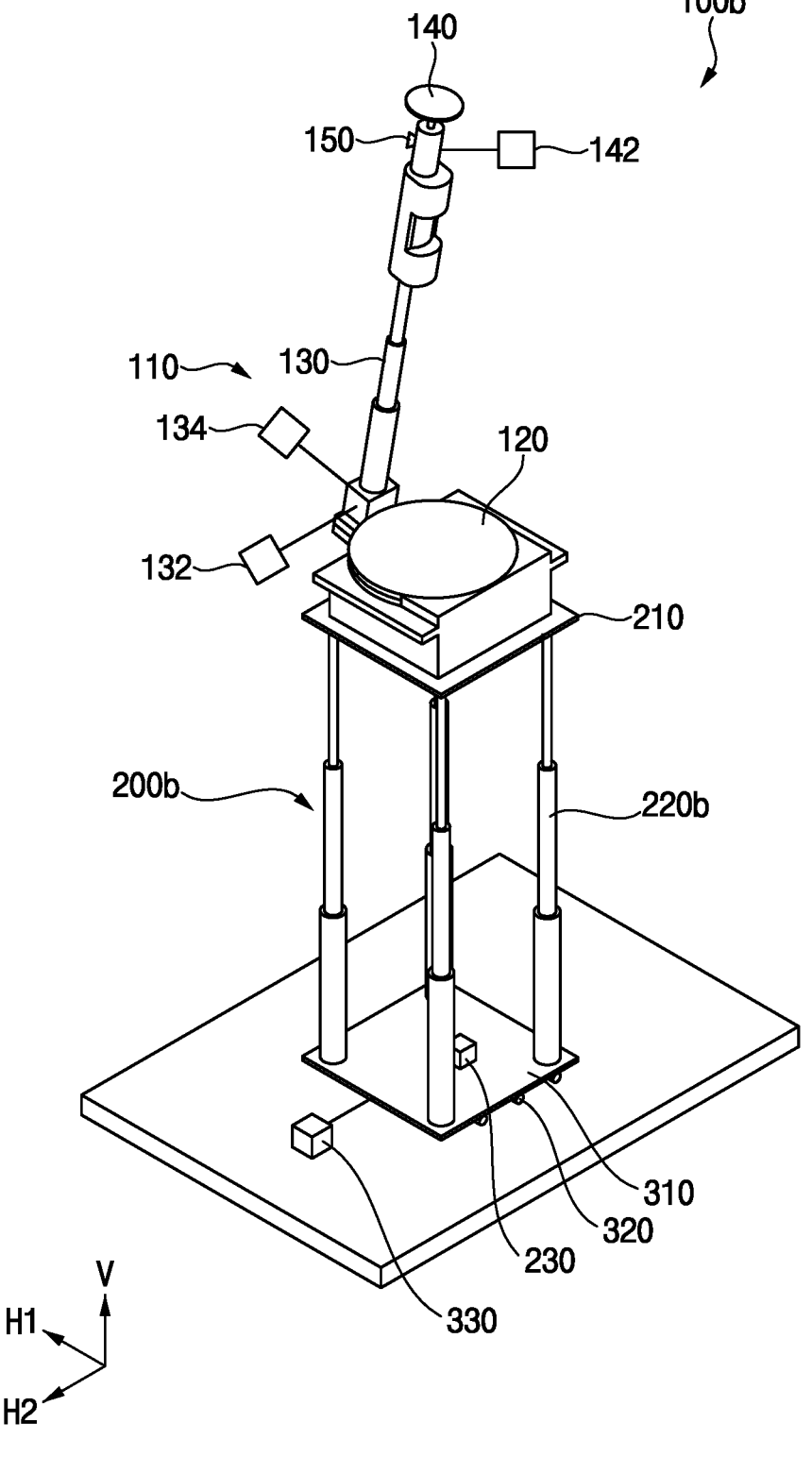

FIG. 11 is a perspective view illustrating an apparatus for cleaning an EUV light creation chamber in accordance with example embodiments.

A cleaning apparatus 100b of example embodiments may include elements substantially the same as those of the cleaning apparatus 100 in FIG. 1. The cleaning apparatus 100b may further include a vertical movement module 200b. The same reference numerals may refer to the same elements and any further illustrations with respect to the same elements may be omitted herein for brevity.

Referring to FIG. 11, a lifter 220b of the vertical movement module 200b may include a telescopic structure. The telescopic structure may be connected between the vertical movement plate 210 of the vertical movement module 200b and the horizontal movement plate 310 of the horizontal movement module 300. The telescopic structure may include a plurality of telescopic structures connected between portions of the vertical movement plate 210 and portions of the horizontal movement plate 310. For example, the telescopic structure may include four telescopic structures connected between corners of the vertical movement plate 210 and corners of the horizontal movement plate 310, wherein the vertical movement plate 210 and the horizontal movement plate 310 may be rectangular plates.

According to example embodiments, the vertical movement module 200b may have the height control function, and the apparatus may readily enter into the EUV light creation chamber through a door of the EUV light creation chamber. The cleaning apparatus 100b having a low height may be entered into the EUV light creation chamber through a door of the EUV light creation chamber. The low height may be set by the vertical movement module 200b. The cleaning module 110 may approach regions of the inner wall of the EUV light creation chamber having a conical shape by the vertical movement module 200b and the horizontal movement module 300 to remove the contaminant from the inner wall of the EUV light creation chamber. In particular, the hardness of the nano wires of the brush may be higher than the hardness of the contaminant and lower than the hardness of the EUV light creation chamber so that the contaminant on the inner wall of the EUV light creation chamber may be removed without damaging the EUV light creation chamber by the brush.

The foregoing is illustrative of example embodiments and is not to be construed as limiting thereof. Although a few example embodiments have been described, those skilled in the art will readily appreciate that many modifications are possible in example embodiments without departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to specific example embodiments, and that modifications to example embodiments are intended to be included within the scope of the appended claims.

What is claimed is:

1. An apparatus for cleaning an extreme ultraviolet (EUV) light creation chamber, the apparatus comprising:
   a cleaning module;
   a first movement module supporting the cleaning module in the EUV light creation chamber along a first direction; and
   a second movement module supporting the first movement module and configured to linearly move the first movement module along a surface of the EUV light creation chamber in a second direction perpendicular to the first direction and parallel to the surface of the EUV light creation chamber.

2. The apparatus of claim 1, wherein the cleaning module comprises:
   a base disposed on the first movement module and positioned along the first direction by the first movement module;
   a cleaning shaft connected to the base;
   a brush connected to the cleaning shaft; and
   a rotating actuator connected to the brush.

3. The apparatus of claim 2, wherein the brush comprises a plurality of nano wires.

4. The apparatus of claim 3, wherein the nano wires have a hardness higher than a hardness of a contaminant and lower than a hardness of the EUV light creation chamber.

5. The apparatus of claim 2, wherein the brush comprises a plurality of nano wires comprise silver.

6. The apparatus of claim 2, wherein the cleaning shaft comprises a telescopic structure.

7. The apparatus of claim 2, wherein the cleaning module further comprises a tilting actuator tilting the cleaning shaft with respect to the first direction.

8. The apparatus of claim 1, wherein the cleaning module further comprises a sensor measuring a distance to an inner wall of the EUV light creation chamber.

9. The apparatus of claim 1, wherein the first movement module is a vertical movement module having a height control function, and the second movement module is a horizontal movement module, and the vertical movement module comprises:
   a vertical movement plate connected to the cleaning module;

a lifter connected between the vertical movement plate and the horizontal movement module to move the vertical movement plate along the first direction, wherein the first direction is a vertical direction; and a vertical actuator providing the lifter with a vertical movement force.

10. The apparatus of claim 9, wherein the lifter comprises a scissor lift.

11. The apparatus of claim 9, wherein the lifter comprises a telescopic structure.

12. The apparatus of claim 9, wherein the vertical movement module further comprises at least one auxiliary vertical movement plate interposed within the lifter.

13. The apparatus of claim 1, wherein the first movement module is a vertical movement module, and the second movement module is a horizontal movement module, and the horizontal movement module comprises:

a horizontal movement plate connected to the vertical movement module;

a plurality of casters disposed on a lower surface of the horizontal movement plate and moveable along the surface of the EUV light creation chamber, wherein the surface of the EUV light creation chamber is a bottom surface; and a horizontal actuator providing the horizontal movement plate with a horizontal movement force.

14. An apparatus for cleaning an EUV light creation chamber having a conical shape, the apparatus comprising:

a cleaning module;

a vertical movement module supporting the cleaning module in the EUV light creation chamber along a vertical direction, the vertical movement module having a height control function; and a horizontal movement module supporting the vertical movement module on a bottom surface of the EUV light creation chamber along a horizontal direction, wherein the cleaning module comprises:

a base disposed on the vertical movement module and positioned along the vertical direction by the vertical movement module;

a cleaning shaft connected to the base;

a brush connected to the cleaning shaft, the brush including a plurality of nano wires that have a hardness lower than a hardness of the EUV light creation chamber;

a rotating actuator connected to the brush; and a sensor measuring a distance to an inner wall of the EUV light creation chamber.

15. The apparatus of claim 14, wherein the nano wires comprise silver, wherein the hardness of the nano wires is higher than a hardness of tin.

16. The apparatus of claim 14, wherein the cleaning module further comprises a tilting actuator tilting the cleaning shaft with respect to the vertical direction.

17. The apparatus of claim 14, wherein the vertical movement module comprises:

a vertical movement plate connected to the cleaning module;

a lifter connected between the vertical movement plate and the horizontal movement module to move the vertical movement plate along the vertical direction, the lifter having a height control function; and a vertical actuator providing the lifter with a vertical movement force.

18. The apparatus of claim 14, wherein the horizontal movement module comprises:

a horizontal movement plate connected to the vertical movement module;

a plurality of casters disposed on a lower surface of the horizontal movement plate and moveable along the bottom surface of the EUV light creation chamber; and a horizontal actuator providing the horizontal movement plate with a horizontal movement force.

19. An apparatus for cleaning an EUV light creation chamber having a conical shape, the apparatus comprising:

a brush disposed at an end portion of a cleaning shaft;

a first tilting actuator disposed on a base and controlling a first tilt of the cleaning shaft;

a second tilting actuator disposed on the base and controlling a second tilt of the cleaning shaft;

a first movement plate supporting the first tilting actuator and the second tilting actuator; and a second movement plate supporting the first movement plate, wherein the first movement plate and the second movement plate are moveable in a first direction and a second direction perpendicular to the first direction.

20. The apparatus of claim 19, wherein the brush comprises a plurality of nano wires having a hardness higher than tin and lower than a hardness of the EUV light creation chamber.

* * * * *